United States Patent
Qiang et al.

(10) Patent No.: US 10,451,748 B1
(45) Date of Patent: Oct. 22, 2019

(54) READOUT CIRCUIT FOR A SILICON PHOTOMULTIPLIER (SIPM) ARRAY USING CHARGE SHARING AND ANGER LOGIC

(71) Applicant: CANON MEDICAL SYSTEMS CORPORATION, Otawara-shi (JP)

(72) Inventors: Yi Qiang, Vernon Hills, IL (US); Steve Ross, Darien, IL (US); Peng Peng, Davis, CA (US)

(73) Assignee: CANON MEDICAL SYSTEMS CORPORATION, Otawara-shi (JP)

( * ) Notice: Subject to any disclaimer, the term of this patent is extended or adjusted under 35 U.S.C. 154(b) by 0 days.

(21) Appl. No.: 16/211,072

(22) Filed: Dec. 5, 2018

(51) Int. Cl.
*G01T 1/24* (2006.01)
*G01T 1/20* (2006.01)
*H01L 27/146* (2006.01)
*G01T 1/208* (2006.01)

(52) U.S. Cl.
CPC .............. *G01T 1/247* (2013.01); *G01T 1/208* (2013.01); *G01T 1/248* (2013.01); *G01T 1/249* (2013.01); *H01L 27/14663* (2013.01)

(58) Field of Classification Search
CPC ......... G01T 1/208; G01T 1/247; G01T 1/248; G01T 1/249; H01L 27/14663
See application file for complete search history.

(56) References Cited

U.S. PATENT DOCUMENTS 8,884,240 B1 * 11/2014 Shah .................... G01R 33/481
250/363.05
2014/0246594 A1 9/2014 Pichler et al.
2015/0285922 A1 10/2015 Mintzer et al.
2017/0315046 A1 11/2017 Du et al.
2018/0156926 A1 6/2018 Frach et al.
2018/0283938 A1 10/2018 Gascon Fora et al.

OTHER PUBLICATIONS

Beien Wang, "3D Scintillation Positioning Method in a Breast-specific Gamma Camera" Thesis, KTH Royal Institute of Technology, Degree Project in Medical Engineering, Second Level, Stockholm, Sweden 2015.
Ashley T. Tao, "Development of a Silicon Photomultiplier Based Gamma Camera" Thesis, McMaster University, Hamilton Ontario, Oct. 2011.
Sensl; "Readout Methods for Arrays of SiPM" Sense Light (sensl), published Mar. 12, 2015; pp. 1-15, www.sensl.com.

* cited by examiner

*Primary Examiner* — Mark R Gaworecki
(74) *Attorney, Agent, or Firm* — Oblon, McClelland, Maier & Neustadt, L.L.P.

(57) ABSTRACT

A method and an apparatus are provided for using a capacitor chain to perform charge sharing and Anger logic to determine, for charge pulses arising from gamma-ray detection, a row position along an array of scintillation-based gamma-ray detectors. Further, high-pass filters configured at the ends of the capacitor chain perform pulse shaping to preserve timing information. To determine the column position for charge pulses, a two-stage summing amplifier configuration is used with weighting amplifiers controlling the relative gain of the second-stage amplifier with respect to respective columns in the array. Each detector element in the array is a silicon photomultiplier (e.g., Geiger-mode avalanched photodiodes biased above breakdown voltage). Position information can be generated by Anger logic on four outputs from the second-stage amplifiers. Energy and timing information can be generated as a sum of the four outputs from the second-stage amplifiers.

19 Claims, 16 Drawing Sheets

$$V_{output} = -\left(1 + \frac{R_{a2}}{R_{a1}}\right) \sum_i \frac{R_{a3}}{R_{yi}} V_{xi}$$

READOUT CIRCUIT FOR A SILICON PHOTOMULTIPLIER (SIPM) ARRAY USING CHARGE SHARING AND ANGER LOGIC

FIELD

This disclosure relates to position detection in gamma-ray detectors, and, more particularly, to readout circuitry that uses charge sharing to multiplex signals from many gamma-ray detector elements in a detector array to a few (four) outputs from which position information or crystal identity (ID) information is retrieved via Anger logic.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

In positron emission tomography (PET) imaging, a tracer agent is introduced into the patient, and the physical and bio-molecular properties of the agent cause it to concentrate at specific locations in the patient's body. The tracer emits positrons, resulting in an annihilation event occurs when the positron collides with an electron that produces two gamma rays (at 511 keV) traveling at substantially 180° apart.

PET imaging systems use detectors positioned around the patient to detect coincidence pairs of gamma rays. A ring of detectors can be used in order to detect gamma rays coming from each angle. Thus, a PET scanner can be substantially cylindrical to maximize the capture of the isotropic radiation. A PET scanner can be composed of several thousand individual crystals (e.g., Lutetium Orthosilicate (LYSO) or other scintillating crystals) which are arranged in two-dimensional scintillator arrays that are packaged in modules with photodetectors to measure the light pulses from respective scintillation events. For example, the light from respective elements of a scintillator crystal array can be shared among multiple photomultiplier tubes (PMTs), or the light can be detected by silicon photomultipliers (SiPMs) having a one-to-one correspondence with the elements of a scintillator crystal array.

Tomographic reconstruction can be used to reconstruct the spatial distribution of the tracer. To this end, each detected event is characterized for its energy (i.e., amount of light generated), its location, and its timing. When a coincidence is detected based on the arrival times of two gamma rays, a line can be drawn between the two locations at which the two gamma rays are detected, i.e., the line-of-response (LOR), and the location of the positron-electron annihilation is somewhere along this LOR. The timing information can also be used to narrow down where along the LOR the annihilation likely occurred by determining a statistical distribution along the LOR based on the time-of-flight (TOF) information, e.g., a difference between the arrival times of the two gamma rays and the resolution of the arrival times.

The position information depends on being able to determine either the arrival position or the identity of scintillator crystal at which a given gamma ray was detected. When PMTs are used as the photodetectors, a many-to-few relationship can result in the light from an array of many scintillator crystal elements (e.g., a 10-by-10 array having 100 crystal elements) being detected and readout by a few PMTs (e.g., four PMTs arranged in a square). When there is light sharing among the PMTs, Anger logic/arithmetic can be used to approximately determine/estimate an interaction position based on the ratio between the pulse height/energy measured by the respective PMTs. Using a flood-map calibration, the Anger-logic position space can be segmented according to the respective crystal elements, and the segmentation can be stored as a lookup table.

One advantage of the above-discussed many-to-few relationship is that only a few channels are needed to multiplex and readout signals from a large number of scintillator crystals, simplifying the readout electronics.

Silicon photomultipliers (SiPMs) can have a much smaller detection area than PMTs, making possible a one-to-one coupling between the SiPMs and the respective scintillator crystals. Nevertheless, a reduced number of readouts can still be desirable when using SiPMs for PET detection. The apparatus for reducing the number of readouts would advantageously not sacrifice performance in detecting timing and/or energy information. Accordingly, improved approaches to reduce the number of readouts for SiPM-based pixelated gamma ray detectors are desired.

BRIEF DESCRIPTION OF THE DRAWINGS

A more complete understanding of this disclosure is provided by reference to the following detailed description when considered in connection with the accompanying drawings, wherein.

DETAILED DESCRIPTION

Figure 1A:
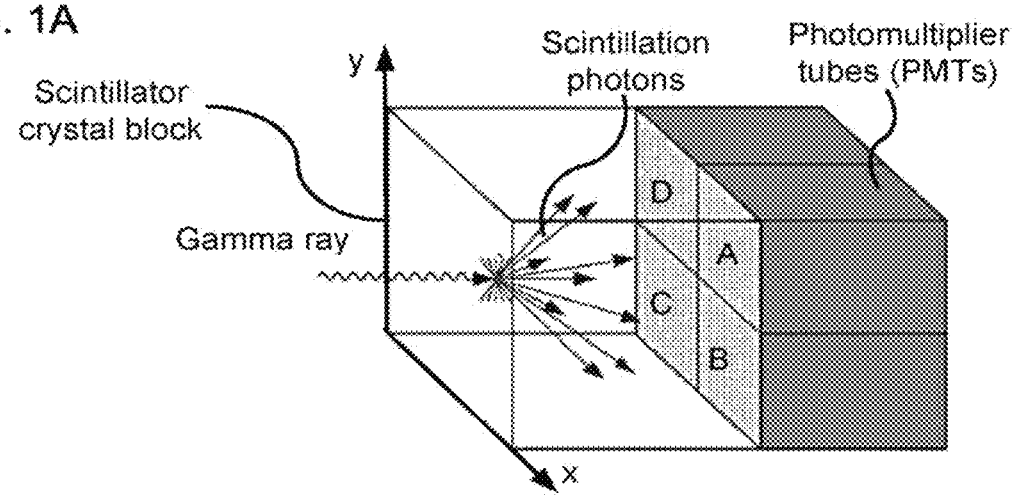
FIG. 1A is an example diagram of a detector module having a single crystal block and photomultiplier tubes (PMTs), according to one implementation.

As discussed above, improved approaches to reduce the number of readouts for SiPM-based pixelated gamma ray detectors are desired. The approaches described herein can variously include, at a first stage, (i) using a capacitor chain for charge-sharing Anger Logic in rows, (ii) terminating both ends of a charge-sharing chain with (a) high-pass filters and/or (b) high-bandwidth amplifiers. These features have the advantages of (i) suppressing dark noise, (ii) improving the signal-to-noise ratio (SNR), and (iii) maintaining pulse shape for the following summing stage. Further, the approaches described herein can include, at a second stage, using weighting resistors with high-bandwidth amplifiers to sum all the rows and generate four final outputs. Anger logic can then be performed on these four outputs to uniquely identify the crystal element at which a detection event occurred.

In general, this process can be referred to as charge-sharing Anger logic, analogous to light-sharing Anger logic arising in the context of PMT-based pixelated gamma ray detectors. In the charge-sharing Anger logic apparatus described herein, the charge from a SiPM pixel is distributed to four outputs through capacitors that are configured to convey information regarding the position of the detector element within a column of the array (column information). Further, the weighting resistors are configured to convey information regarding the position of the detector element within a row of the array (row information). Moreover, because the row and column information is encoded into four outputs corresponding to conventional light-sharing Anger logic, these novel SiPM-based detector modules and readout circuitry can be readily integrated with existing PET systems that are configured for PMT-based detector modules using light-sharing Anger logic (e.g., the Celesteion™ PET/CT system by Canon Medical Systems Corp.).

SiPMs are novel solid state photodetectors, which can significantly improve the performance of PET systems relative to existing PMT-based approaches. For example, SiPM-based PET systems can take advantage of the better geometric coverage and higher photon detection efficiency of SiPMs. Further, SiPMs naturally provide position information of incoming photons because they can have a detection area that is approximately equal to the cross-sectional area of the respective scintillator crystal elements in a detector array, resulting in a one-to-one correspondence between the SiPM photodetectors and the crystal elements. Because the size of a SiPM can be customized to match the size of the crystal, it is possible to build a SiPM PET system with one-on-one readout configuration to achieve optimal performance with minimum optical sharing. However, the data acquisition electronics with high readout channel density also costs more than a multiplexed readout having lower channel density. Accordingly, it is desirable to develop an optimal multiplexing circuit for PET applications.

Preferably, a multiplexing circuit for PET applications avoids undesirable side effects that can degrade the timing and energy information. For example, two significant side effects of multiplexing SiPMs can be higher dark rate due to large total pixel area and wider pulse shape due to larger detector capacitance. Both of these two side effects can degrade the timing performance. Degradation of the timing performance can at least partly be mitigated by using capacitive charge sharing and/or adding a high-pass filter. For example, in certain implementations of the apparatus, a capacitor chain, which links together a row of SiPMs to perform charge sharing, can be terminated with a high-pass filter to provide a simple yet high-performance one-dimensional (ID) SiPM array readout solution.

In contrast to the PET system and SiPM readout apparatus/circuitry described herein, other approaches suffer from various shortcomings. For example, compared to the pulse shape of an SiPM by itself, when the outputs of an array of SiPMs are simply combined/multiplexed without a capacitor chain and without amplifiers acting as buffers, the pulse shape can be significantly and adversely affected. Further, when the SiPMs are wired together, their aggregated capacitance is larger than each SiPM separately, increasing the decay time of the output pulse of the multiplexed SiPMs and reducing the pulse amplitude. Moreover, the dark count rate will also increase proportionally with the total aggregated capacitance/area of the multiplexed SiPMs. As a result, the timing performance of these other approaches is degraded due to reduced signal to noise ratio (SNR).

Further regarding other approaches that do not use amplifiers acting as buffers, the pulse shape generated by an SiPM can be sensitive to the impedance at the output terminal. Without an amplifier stage terminating a row of SiPMs, the pulse shape from the row of SiPMs is susceptible to signals and circuit components from downstream, presenting an obstacle to maintain the pulse shape of the multiplexed signal. Thus, these other approaches might fail to keep a stable reading of timing and energy, which are important for the performance of PET systems.

As discussed above, Anger logic can be used to reduce the number of readout channels for a variety of applications. For example, PMT-based positron emission tomography (PET) detectors use light-sharing Anger Logic to decode small crystals for position information.

Figure 1B:
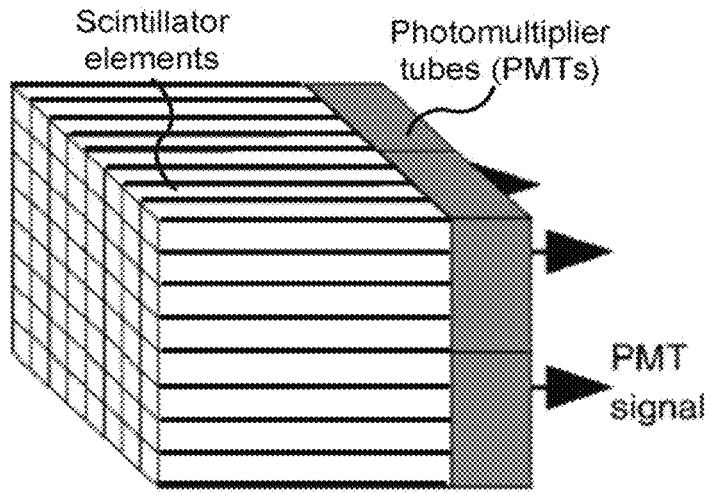
FIG. 1B is an example of a detector module having a block of crystals arranged as an array of scintillator elements and using PMTs as photodetectors, according to one implementation.
Figure 1C:
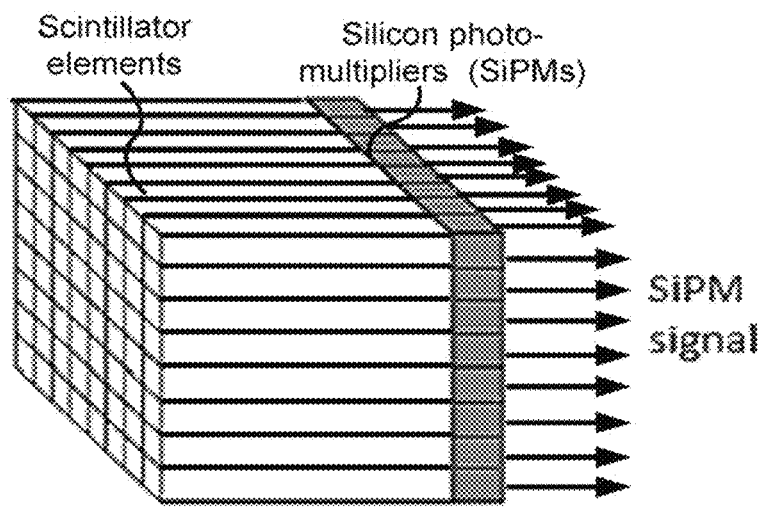
FIG. 1C is an example of a detector module having crystals arranged as an array of scintillator elements and using silicon photomultipliers (SiPMs) as photodetectors, according to one implementation.

Referring now to the drawings, wherein like reference numerals designate identical or corresponding parts throughout the several views, FIGS. 1A, 1B, and 1C show several non-limiting implementations of a gamma ray detector (also referred to as a gamma camera). In FIG. 1A, the scintillator crystal is a single monolithic block, and the location of the scintillation event converting the gamma ray photon into secondary photons can be detected by an array of photodetectors, which are illustrated here as photomultiplier tubes (PMTs). The location of the scintillation event can be determined using Anger arithmetic. For example, the four PMTs are labeled "A," "B," "C," and "D." The Anger coordinates corresponding the x-direction and the y-direction can be respectively given by $$X_a = \frac{(A+B)-(C+D)}{A+B+C+D} \text{ and}$$

$$Y_a = \frac{(A+D)-(C+B)}{A+B+C+D}.$$

Alternatively, the Anger coordinates corresponding the x-direction and the y-direction can be respectively given by $$X_b = \frac{A-C}{A+C}\cos\left(\frac{\pi}{4}\right) + \frac{B-D}{B+D}\sin\left(\frac{\pi}{4}\right) \text{ and}$$

$$Y_b = \frac{A-C}{A+C}\sin\left(\frac{\pi}{4}\right) - \frac{B-D}{B+D}\cos\left(\frac{\pi}{4}\right).$$

In a third implementation of Anger arithmetic, the Anger coordinates corresponding the x-direction and the y-direction can be respectively given by a mixture of the above to results, i.e., $$X_c = \alpha X_a + (1-\alpha) X_b \text{ and}$$

$$Y_c = \alpha Y_a + (1-\alpha) Y_b,$$

wherein $\alpha \in \{0,1\}$ is a constant selected to mitigate pin cushion effects.

In FIG. 1B, the scintillator is cut into a periodic array of separate crystals separated and optically isolated by reflective barriers between the individual elements of the crystal array. This optical isolation between crystals in the block can be imperfect allowing some light sharing between adjacent crystals. When the photodetectors are PMTs, the light sharing between adjacent crystals can be small compared to light sharing that occurs after exiting the crystals, in which case, scintillation events can be distinguished between individual elements of the array using Anger arithmetic to approximately determine locations, and then using a floodmap calibration to generate a lookup table mapping the approximate locations calculated using Anger arithmetic to respective indices of the crystal array.

In FIG. 1C, the light from each crystal element is detected by a respective silicon photomultiplier (SiPM). With each crystal having its own photodetector, the light sharing among photodetectors can be reduced. Further, each crystal can be optically isolated from adjacent crystal elements by, e.g., a reflective material provided between the crystal elements or by a material having a low refractive index, resulting in Fresnel reflection and total internal reflection for rays greater than the critical angle.

Figure 2A:
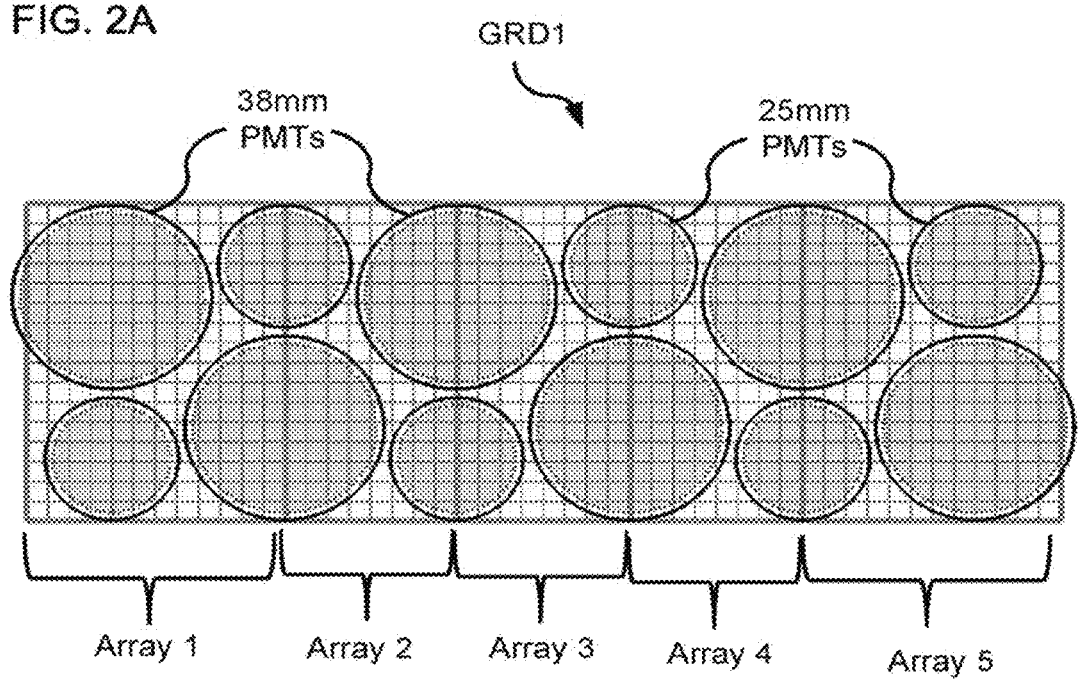
FIG. 2A shows a top view of a gamma-ray detector (GRD) module using PMTs, according to one implementation.
Figure 2B:
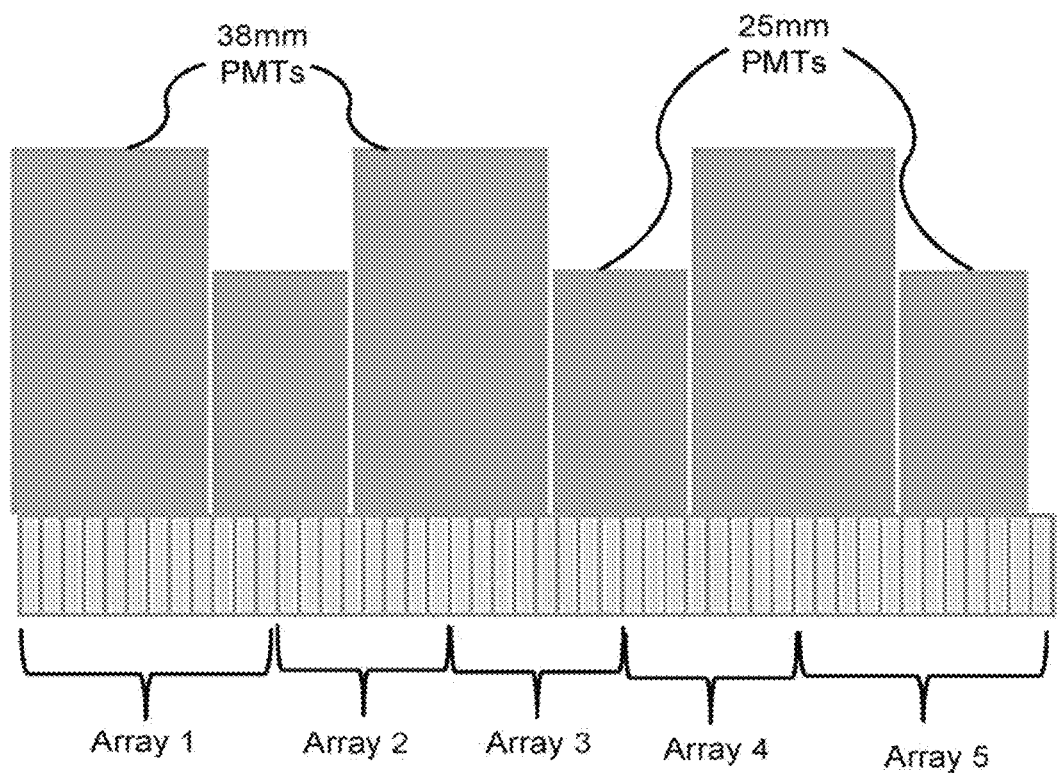
FIG. 2B shows a side view of the PMT-GRD module, according to one implementation.
Figure 2C:
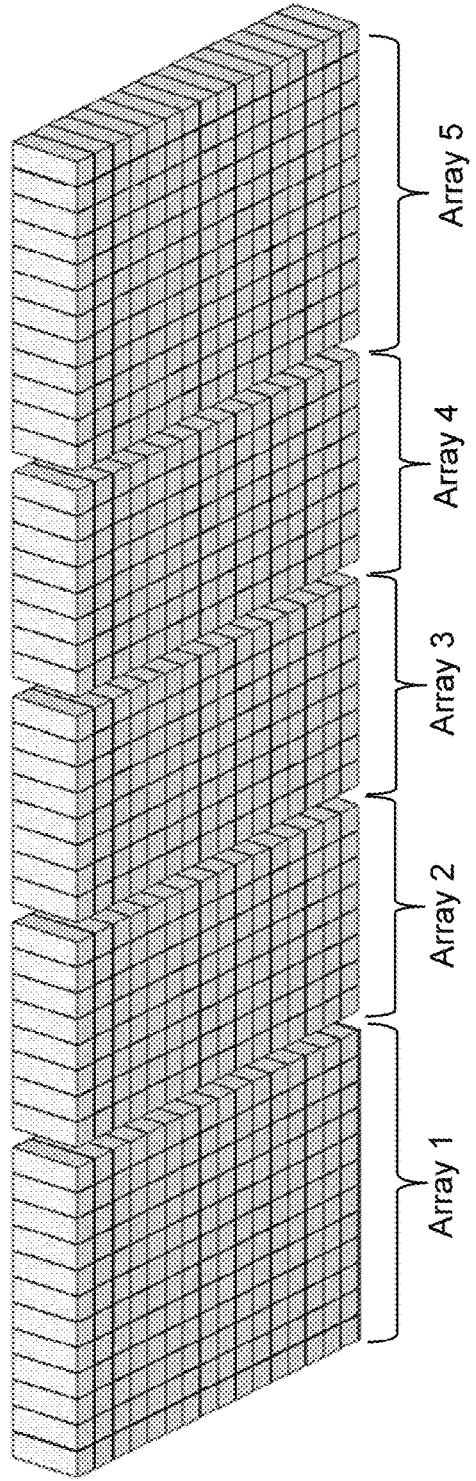
FIG. 2C shows a perspective view of a series of scintillator crystal arrays, according to one implementation.
Figure 2D:
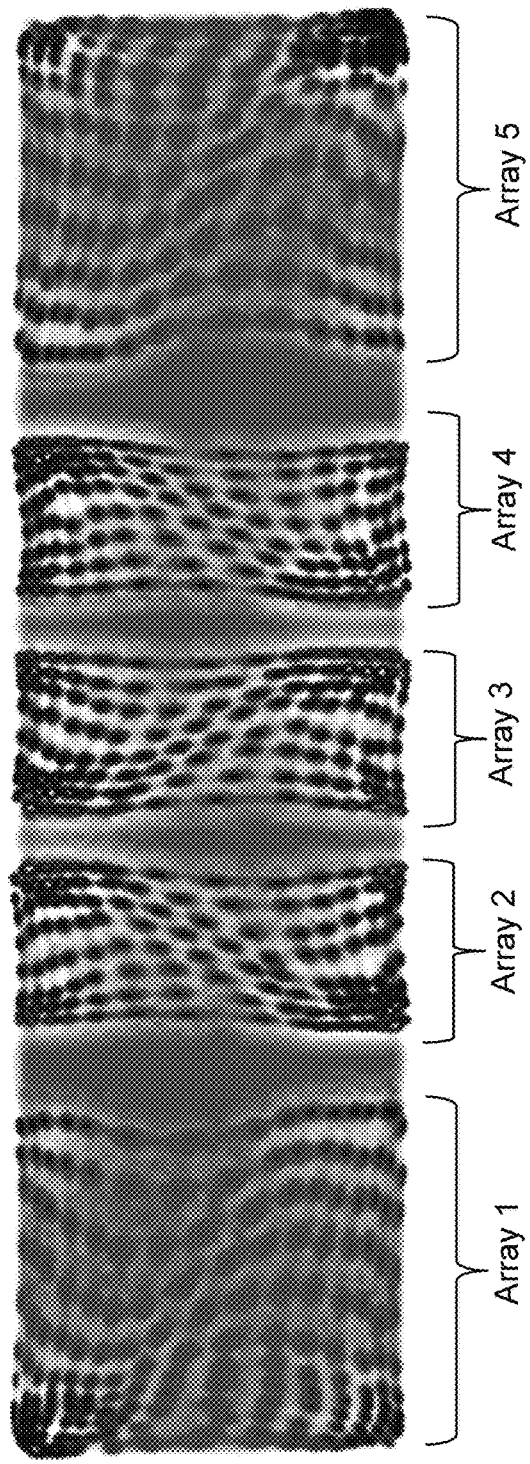
FIG. 2D shows a top view of a floodmap calibration of counts as a function of position calculated using Anger logic, according to one implementation.

FIGS. 2A and 2B respectively show top and side views of a non-limiting example of a PMT-based detector module that uses two different sizes of PMTs (25 mm PMTs and 38 mm PMTs) to cover a larger percentage of the area of the scintillator crystal arrays than can be achieved using PMTs all of the same size. Array 1 and array 5 are 11 pixels by 16 pixels, and array 2, array 3, and array 4 are 8 pixels by 16 pixels. FIG. 2C shows a prospective view of the five crystal arrays, and FIG. 2D shows a floodmap calibration of a histogram of counts as a function of the approximate positions calculated using Anger arithmetic. Because Anger arithmetic generates approximate positions, the local maxima of the histogram can be identified as corresponding to the centers of respective crystal elements, and then stored as a position calibration in a lookup table that is used when determining the position information (e.g., $\vec{x}_i$ of the central coordinates of channel i). Further, FIG. 2D illustrates the pin-cushion effect often observed in light-sharing Anger logic.

Figure 3:
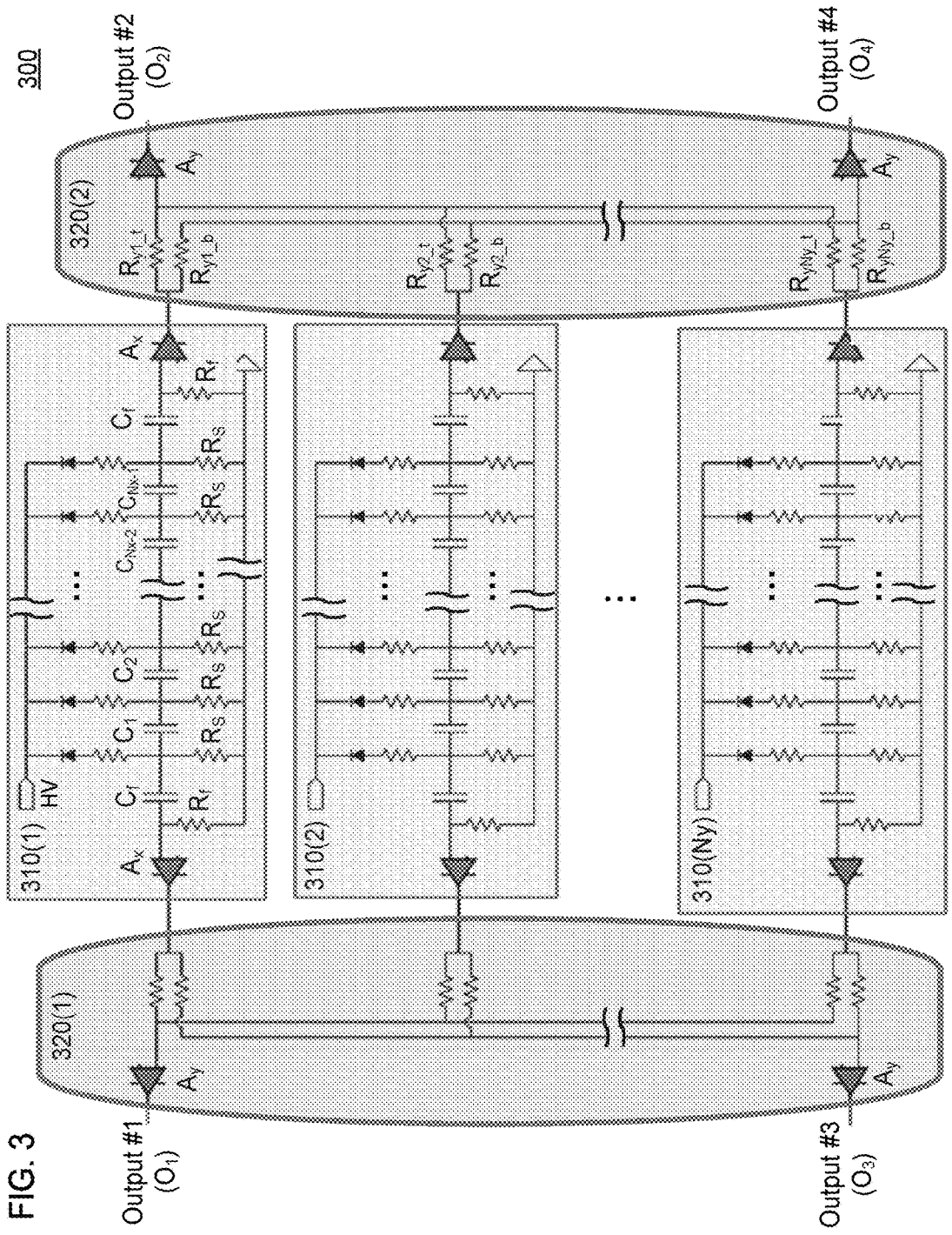
FIG. 3 is an example of a circuit diagram of a hybrid two-dimensional (2D) multiplexing scheme using capacitor chains for charge sharing and using two-stage summing amplifiers to generate outputs that can be used with Anger Logic to generate position information, according to one implementation.
Figure 4:
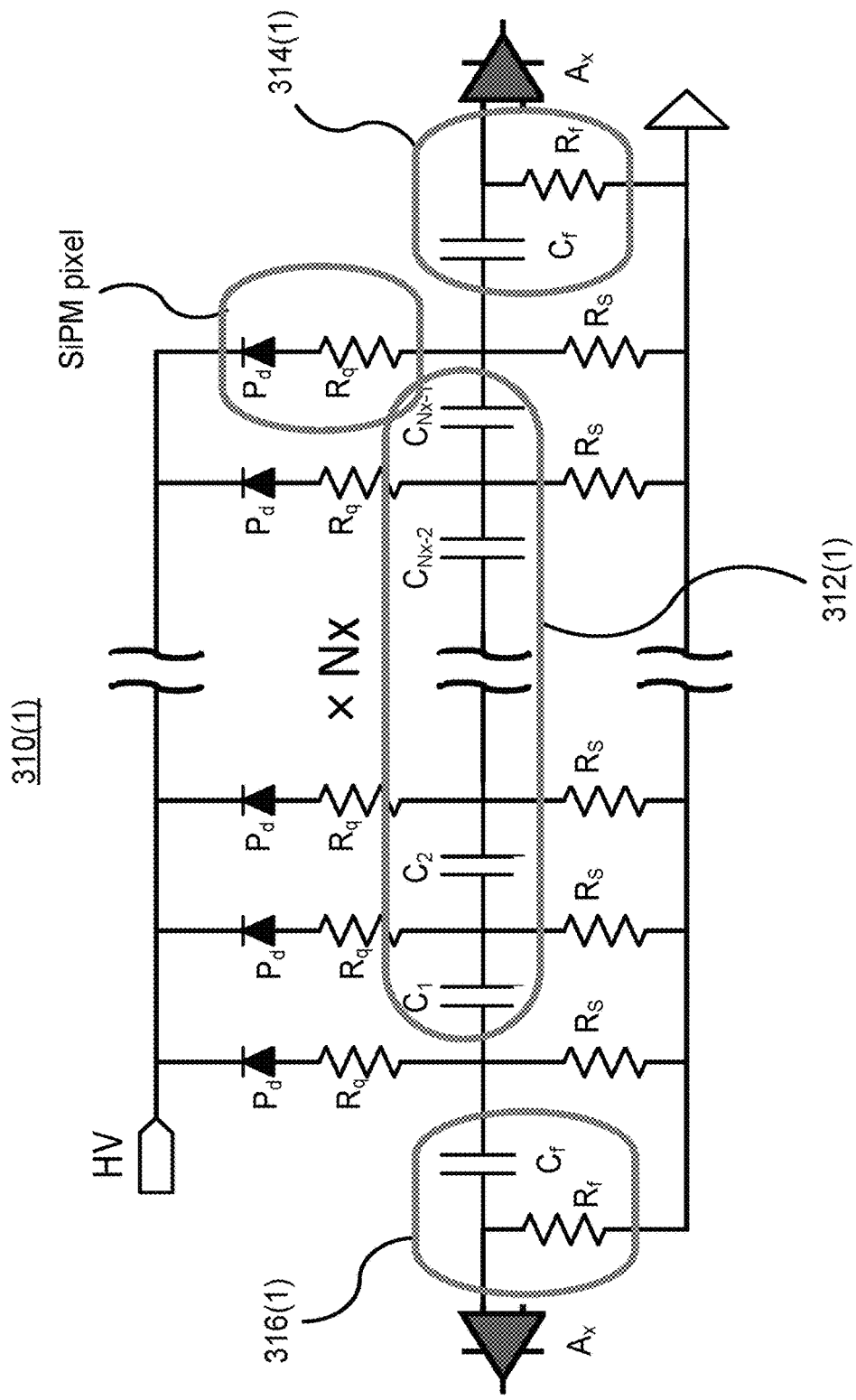
FIG. 4 is an example of a circuit diagram of a capacitor chain for charge sharing among a row of SiPMs, according to one implementation.
Figure 5:
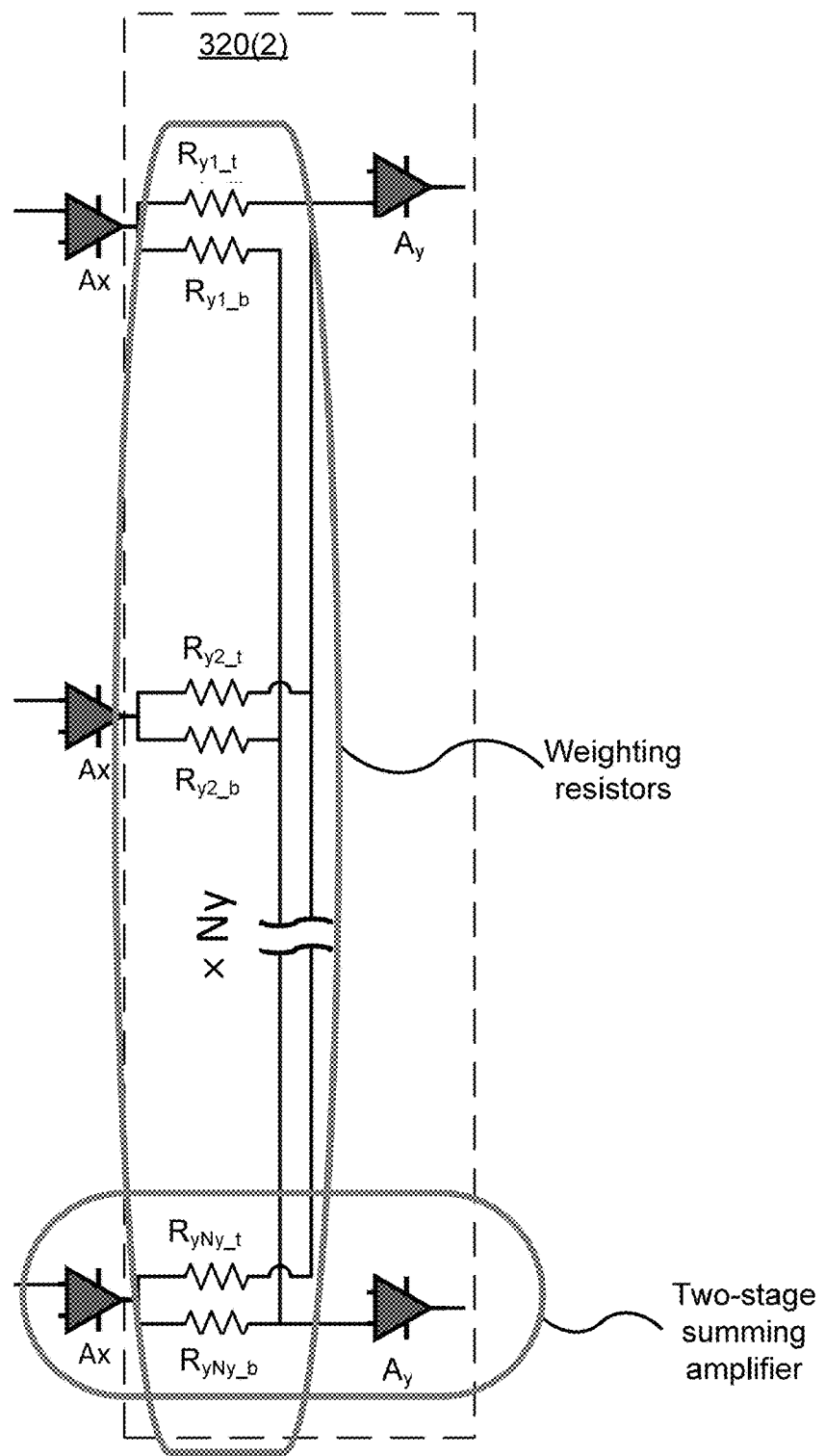
FIG. 5 is an example of a circuit diagram of a two-stage summing amplifier configuration using weighting resistors to set gain values for respective rows, according to one implementation.

In contrast to the light-sharing Anger logic illustrated in FIGS. 2A, 2B, 2C, and 2D, the SiPM detector modules described herein achieve a reduced number of readout through multiplexing based on charge-sharing Anger logic. FIGS. 3-5 show a charge-sharing readout apparatus 300 that multiplexes an array of Nx by Ny SiPMs to four outputs $O_1$-$O_4$. Nx SiPMs in each row are combined by a respective capacitor chain circuit 310(1), 310(2), . . . , 310(Nx). Then the outputs from these capacitor chain circuits are amplified and combined using weighting resistors configured in a two-stage summing amplifier configuration.

In certain implementations, the rows of SiPMs are chained together using a capacitor chain for Angler logic, followed by high-pass filters, and then terminated by amplifiers. The column information is then encoded by the weighting resistors in a second stage. In addition to other functions, the amplifiers act as buffers, compartmentalizing and isolating the circuit into parts. Thus, the pulse shape and amplitude of a signal do not degrade when more rows of SiPMs are added.

FIG. 4 shows that, in certain implementations, the row information is multiplexed using respective capacitor-chain circuits 310(1), 310(2), . . . , 310(Nx), of which 310(1) is illustrated as representative. In the capacitor chain circuit 310(1), each SiPM pixel can be represented as a photodetector $P_d$ (e.g., a collection of parallel Geiger-mode avalanche photodiodes) biased at the cathode to a high-voltage (HV) set above the breakdown voltage, and the photodetector $P_d$ is arranged in series with a quenching resistor $R_q$. The signal/current from the SiPM pixels in the first capacitor chain circuit 310(1) are combined by a capacitor chain 312(1) including capacitors $C_1$, $C_2$, . . . $C_{Nx-2}$, and $C_{Nx-1}$. Resistors Rs act as bias resistors provided between ground and the capacitors in the capacitor chain 312(1), bleeding-off the accumulated charge from the capacitors $C_1$, $C_2$, . . . $C_{Nx-2}$, and $C_{Nx-1}$ and, at steady state, restoring the photodiode signals to ground. At each end of the capacitor chain 312(1), high-pass filters 314(1) and 316(1) are respectively provided to shape the pulses and prevent degradation of the timing information. After each high-pass filter, an amplifier Ax is provided, acting as a buffer to decouple the $i^{th}$ capacitor chain circuit 310(1) from the following circuit elements. Otherwise, the performance of the capacitor chain circuit can depend on the terminal impedance and other downstream circuit elements.

FIG. 5 shows that, in certain implementations, the column information is multiplexed using two weighting-resistor circuits 320(1) and 320(2), of which 320(2) is illustrated as representative. The top resistors $R_{y1\_t}$, $R_{y2\_t}$, and $R_{yNy\_t}$ apply various weights to the voltages $V_{xi}$ (see FIG. 6) from the respective capacitor-chain circuits 310. Similarly, the bottom resistors $R_{y1\_b}$, $R_{y2\_b}$, and $R_{yNy\_b}$ apply various weights to the voltages $V_{xi}$ (see FIG. 6) from the respective capacitor-chain circuits 310. The top resistors are combined and amplified to generate the output $O_2$, and the bottom resistors are combined and amplified to generate the output $O_4$. These results are achieved using a two-stage summing amplifier configuration.

Figure 6:
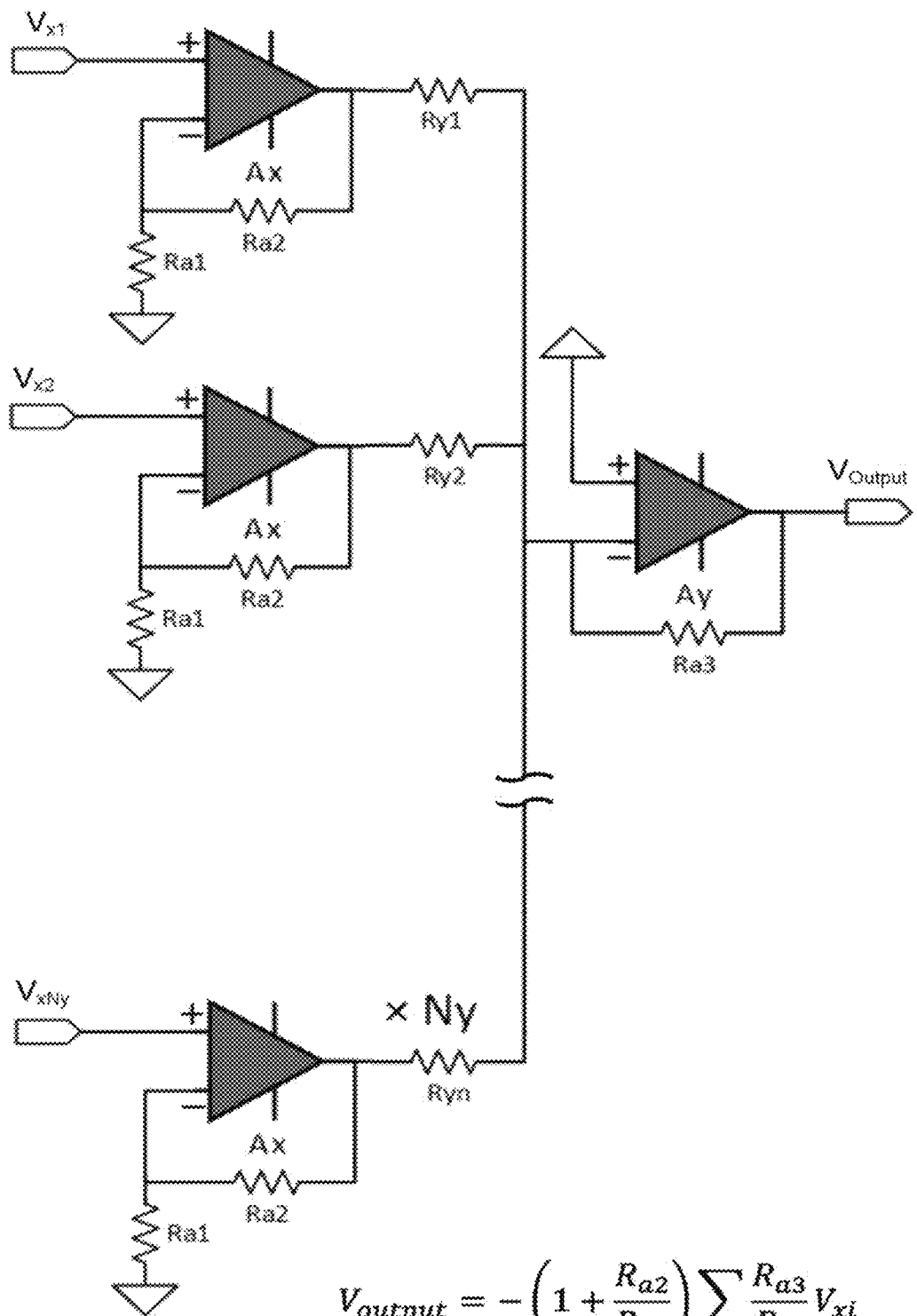
FIG. 6 is another example of the circuit diagram of the two-stage summing amplifier configuration showing the relation between the weighting resistors and the gains for each respective row, according to one implementation.

FIG. 6 shows a non-limiting example of the two-stage summing amplifier configuration using resistor values $R_{a1}$, $R_{a2}$, and $R_{a3}$ to determine the value of the amplification, and the weighting resistor values are shown as $R_{y1}$, $R_{y2}$, and $R_{yn}$. The output voltage is given by $$V_{output} = -\left(1 + \frac{R_{a2}}{R_{a1}}\right) \sum_i \frac{R_{a3}}{R_{yi}} V_{xi}.$$

In certain implementations, the gain $1+R_{a2}/R_{a1}$ of the first amplifier stage can be set in an interval of $\{10,40\}$. For example, the gain can be set to approximately 20. Further, in certain implementations, the gain $R_{a3}/R_{yi}$ of the second amplifier stage corresponding to the ith row can be set be approximately one. For respective rows, the gain for the second amplifier stage is inversely proportional to the weighting amplifiers $R_{yi}$ and determines the fraction of the summed row signal $V_{output}$ that is attributable to each of the respective rows.

The outputs can then be combined according to Anger logic. For example, in certain implementation, X and Y values can be generated according to $$X = \frac{O_1 + O_3 - O_2 - O_4}{O_1 + O_2 + O_3 + O_4} \text{ and}$$

$$Y = \frac{O_3 + O_4 - O_1 - O_2}{O_1 + O_2 + O_3 + O_4}.$$

As would be understood by a person of ordinary skill in the art, other expressions can be used to combine the outputs $O_1$, $O_2$, $O_3$, and $O_4$ to calculate the X and Y values, without departing from the spirit of the method and circuit described herein.

Figure 7:
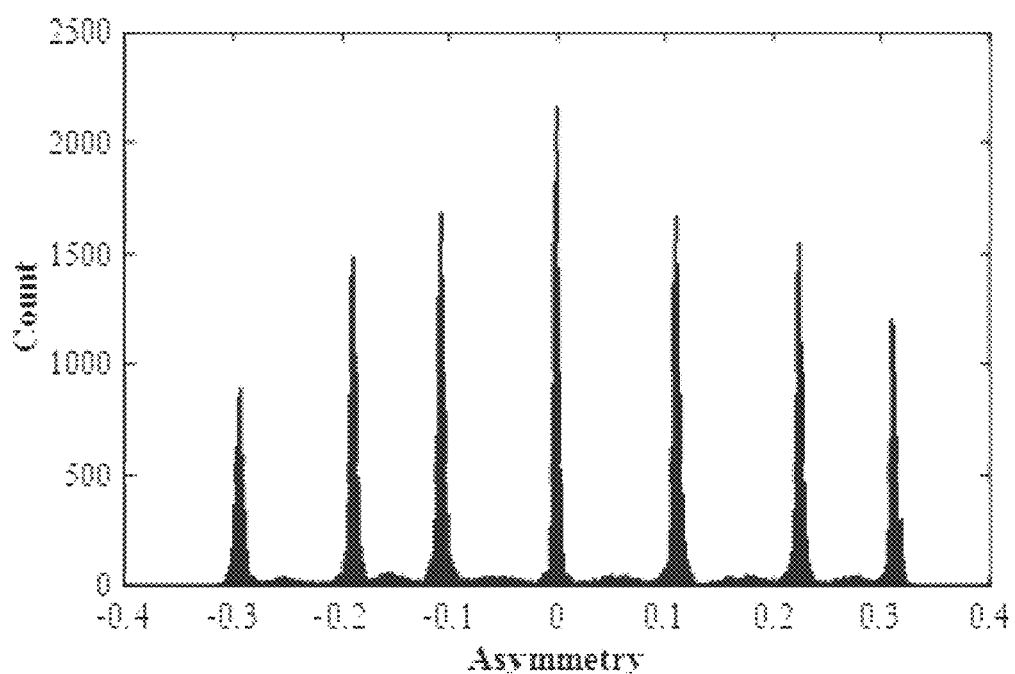
FIG. 7 is a histogram plot of counts detected by a single one-dimensional (1D) array of SiPMs, the counts are plotted as a function of position calculated using Anger logic, demonstrating spatial resolution for crystal identification, according to one implementation.

FIG. 7 shows a plot of the number of counts based on an asymmetry given by $$A = \frac{O_2 - O_1}{O_1 + O_2},$$

wherein to simplify simulation condition there is only a single row of seven SiPM detectors (i.e., $N_y=1$ and $N_x=7$). For example, the asymmetry can be interpreted as –X. These results show that good resolution between the respective detectors is obtained. FIG. 7 shows how the crystals are identified using charge asymmetry. The histogram of charge asymmetry clearly shows seven peaks corresponding to seven crystals. After seven peak positions are extracted, the six middle points between two adjacent peaks can be identified and used to assign crystal identities (IDs). The Crystal ID resolution can be calculated as the average Full Width at Half Maximum (FWHM) of seven peaks divided by the average distance between two adjacent peaks. In the results shown in FIG. 7, the HV is biased 5.5 volts above the breakdown voltage; the high-pass filter uses a capacitance ($C_f$) of 47 pF and a resistance ($R_f$) of 50Ω; in the capacitor chain, the capacitors have a capacitance of 100 nF, and the resistors $R_s$ have a resistance of 1 kΩ.

Figure 8:
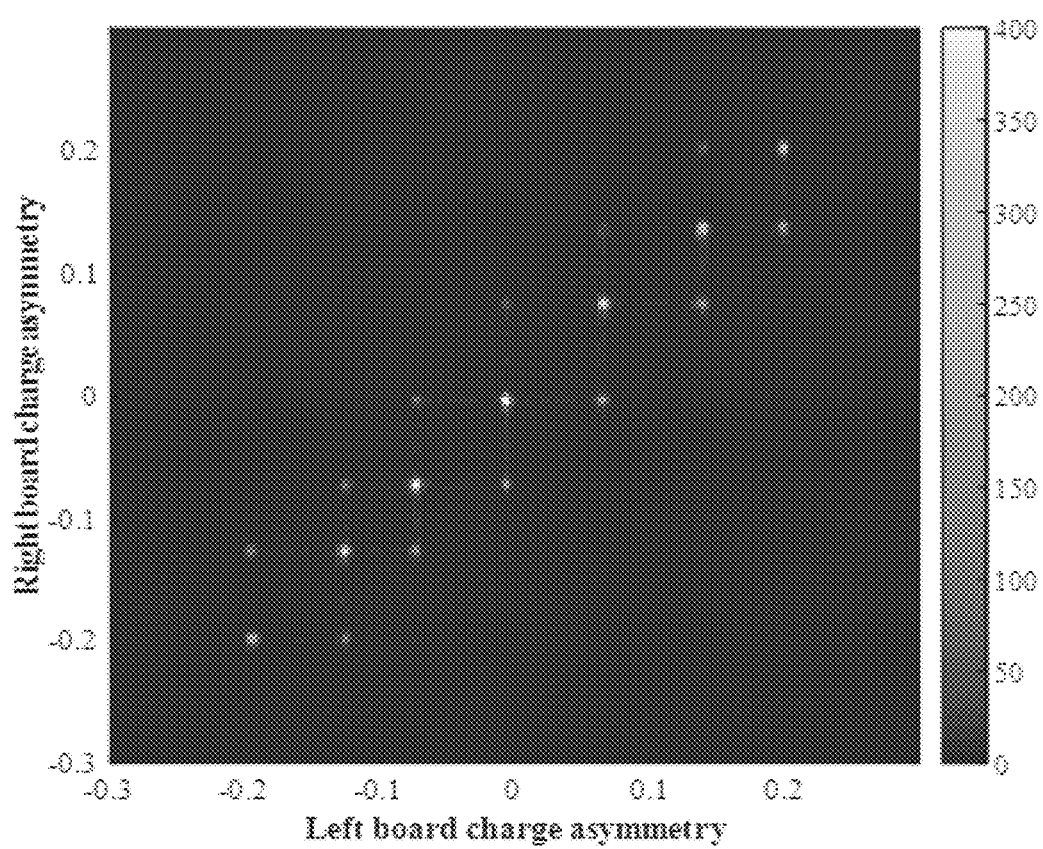
FIG. 8 is a histogram plot of coincidence counts for two 1D SiPM arrays positioned diametrical opposite to each other with a positron emission source arranged in the middle, the coincidence counts being plotted as a function of the positions in the respective crystals, which are calculated using Anger logic, according to one implementation.

FIG. 8 shows counts of coincidence pairs generated when a positron emission source is arranged between two 1D arrays of seven detector elements each, using the same parameters discussed above for FIG. 7.

Figure 9A:
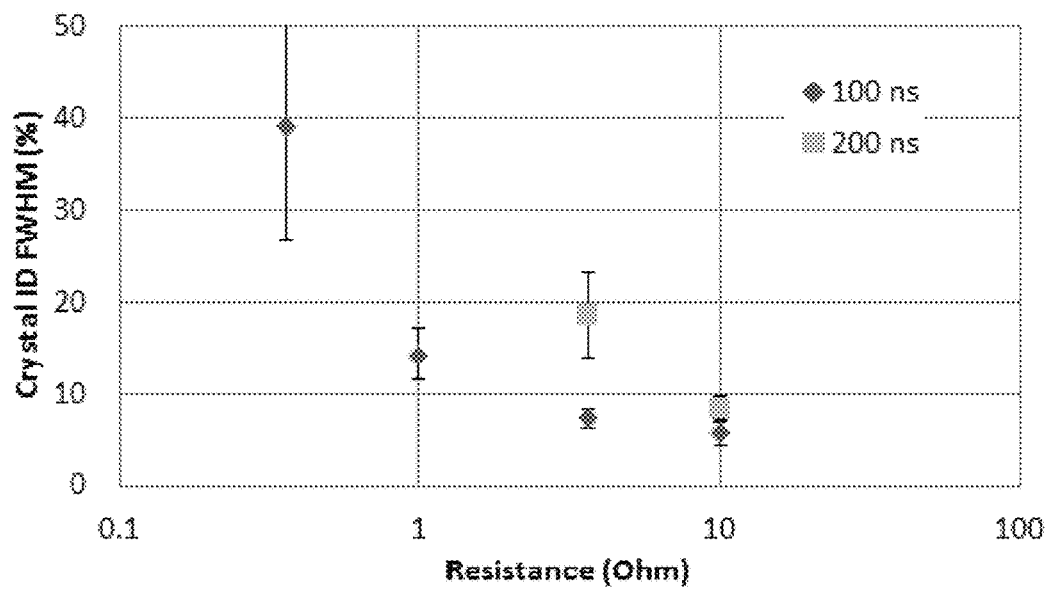
FIG. 9A is a plot of a full-width at half-maximum (FWHM) of the count histogram as a function of position, the FWHM being expressed as a percentage of the spacing (calculated via Anger logic) between adjacent crystals/detectors, the FWHM being plotted as a function of resistances of a resistor chain, according to one implementation.
Figure 9B:
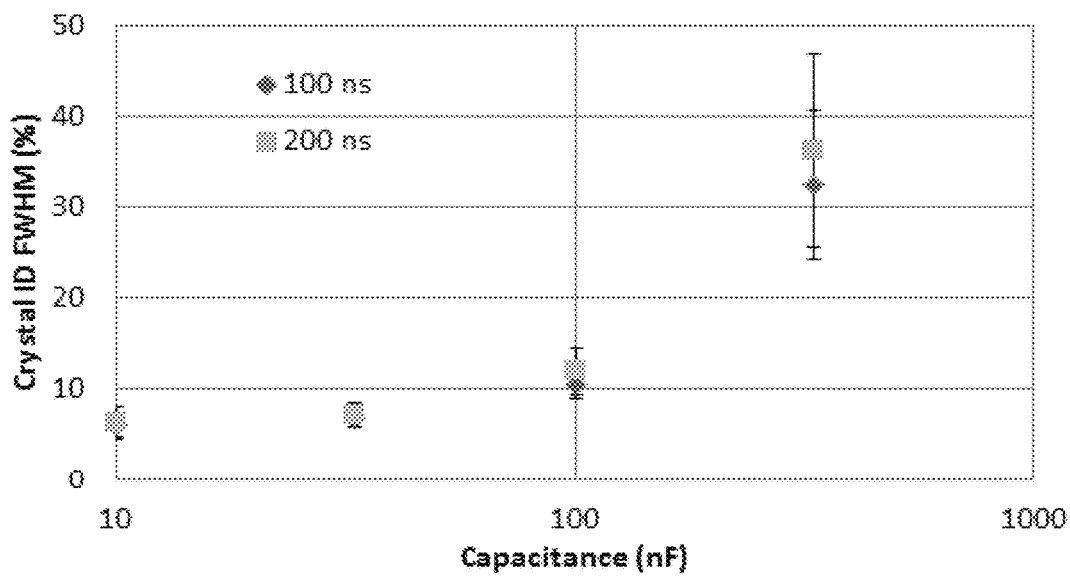
FIG. 9B is a plot of a FWHM of the count histogram as a function of position, the FWHM being plotted as a function of capacitances of a capacitor chain, according to one implementation.

FIGS. 9A, 9B, 9C, and 9D show performance results as a function of the capacitance in the capacitor chain, and, when the capacitor chain is replaced by a resistor chain, the performance is shown as a function of the resistance of the resistors in the resistor chain. As discussed above, the ID resolution shown in FIGS. 9A and 9B can be calculated as the average Full Width at Half Maximum (FWHM) of seven peaks divided by the average distance between two adjacent peaks. The ID resolution was determined using both a 100 nsec. and a 200 nsec. integration window to determine the values $O_1$ and $O_2$. In most cases, only negligible differences in ID resolution resulted from the different sizes of the integration window, but when the difference was not negligible the 100 nsec. integration window consistently yielded better ID resolution. FIG. 9B shows the crystal ID resolution for a capacitor chain, and FIG. 9A shows the crystal ID resolution for a resistor chain.

Figure 9C:
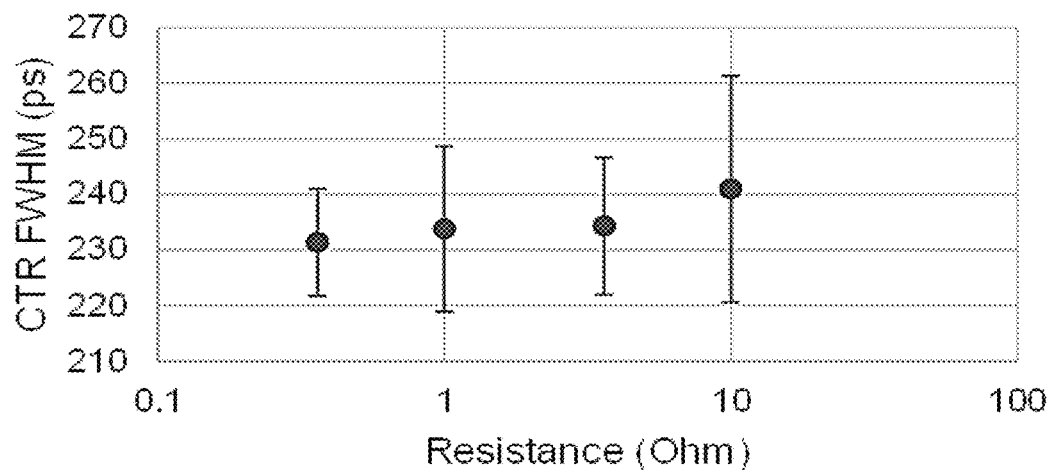
FIG. 9C is a plot of coincidence-time resolutions (CTR) in picoseconds (ps) plotted as a function of resistances of the resistor chain, according to one implementation.
Figure 9D:
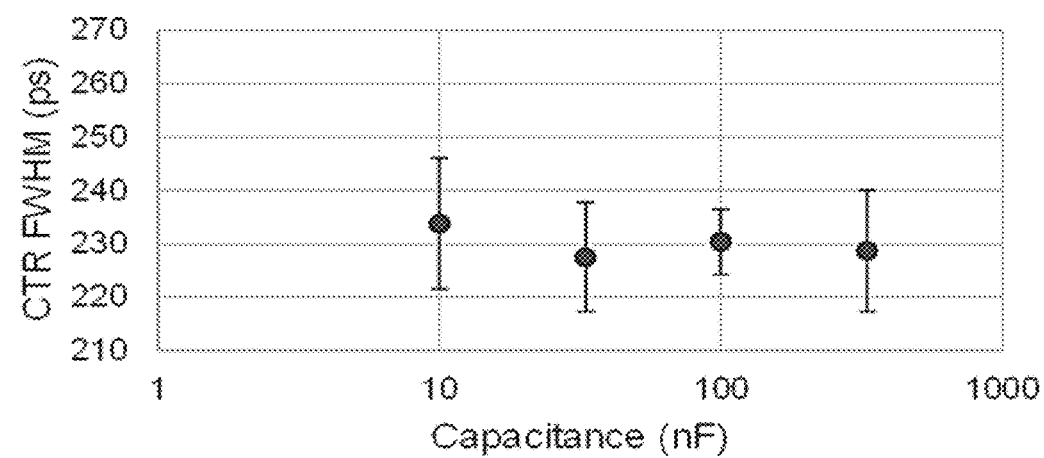
FIG. 9D is a plot of CTR values plotted as a function of capacitances of the capacitor chain, according to one implementation.

Regarding the timing resolution shown in FIGS. 9C and 9D, for a 1D detector array, the output signals/waveforms from both ends of an Anger logic can be summed and then an arrival time can be calculated when the summed signal passing given threshold. A linear interpolation can then be used to get precise time. For example, the charge can be partially integrated using a 100 ns window. The charge asymmetry is used to identify crystals and the total charge is used to select 511 keV total absorption events with a 3-σ window. The FWHM time resolution is first calculated for each possible pairs of crystals using only total absorption events. The average of coincidence time resolution (CTR) curves from the seven major pairs gives the average CTR curve, from which the optimal threshold and best CTR are determined. FIG. 9C shows the CTR (i.e., timing resolution) for a capacitor chain, and FIG. 9D shows the CTR for a resistor chain.

Figure 9E:
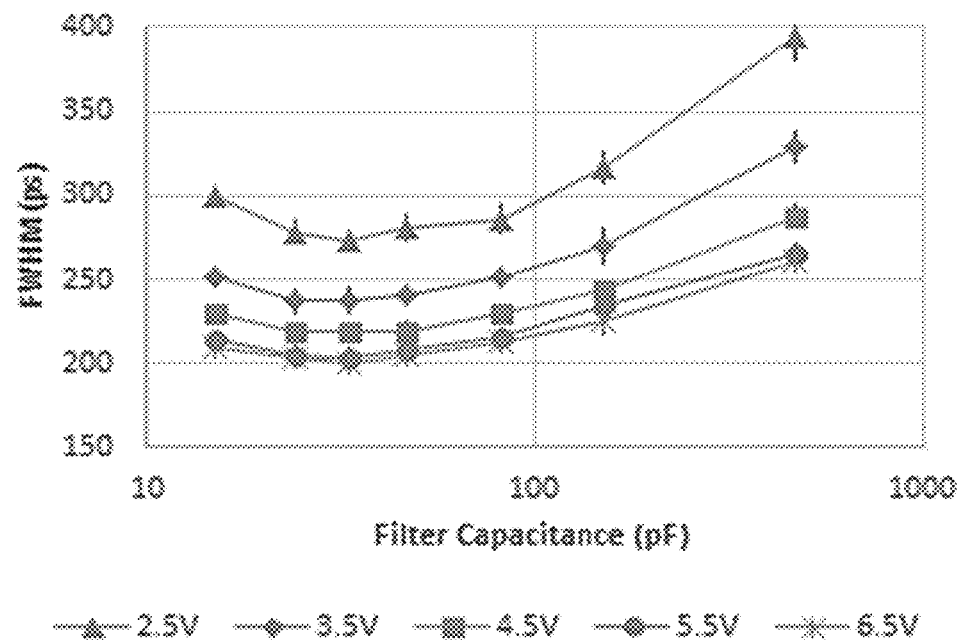
FIG. 9E is a plot of CTR values plotted as a function of a capacitance of a capacitor in a high-pass filter, according to one implementation.

FIG. 9E shows the CTR plotted as a function of the capacitance used in the high-pass filter for various over-bias values at 20° C., wherein the over-bias is the amount the HV exceeds the breakdown voltage. Smaller filter capacitance values help suppress low-frequency noise which directly impact the baseline stability of the signal. However, if the capacitance is too small, the strong attenuation will effectively amplify electrical noise from other sources, such as amplifier and data acquisition. Therefore, according the implementation used for FIG. 9E, the combination of 33 pF and 50Ω high pass filter gives the best CTR performance. The over-bias voltage controls the gain and photon-detection efficiency of the SiPM. Higher over-bias voltage in general gives better time resolution until about 6 V, beyond which the increasing dark noise start to significantly impact the performance.

Figure 9F:
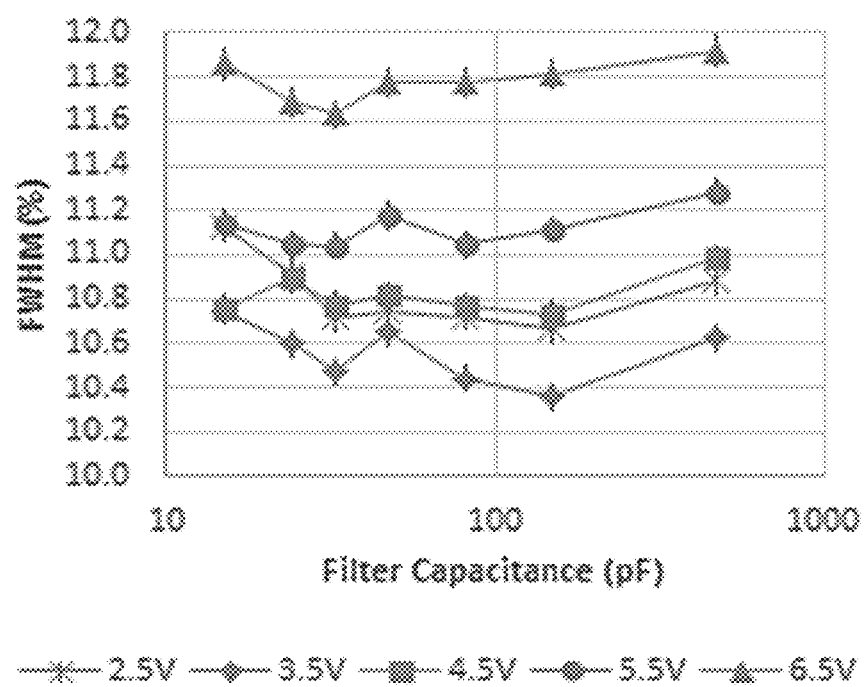
FIG. 9F is a plot of energy resolution expressed as a FWHM percentage of the energy (e.g., 511 keV), the energy resolution being plotted as a function of the capacitance of the capacitor in the high-pass filter, according to one implementation.

Similarly, FIG. 9F shows the energy resolution plotted as a function of the capacitance used in the high-pass filter for various over-bias values. In certain implementations, the energy resolution can be calculated for each of the crystals by extracting the FWHM of the 511 keV total absorption peak. Due to limited number of microcells, the SiPMs exhibit a non-linear response to different input energies. The non-linearity can be approximately parameterized as $$Q = \alpha\left(1 - e^{-\frac{E}{\beta}}\right),$$

wherein Q is the total charge collected from the SiPM (e.g., $Q \propto O_1 + O_2$), E is input gamma ray's energy, α and β are two constants that are adjusted to obtain the best fit to calibration data. For example, the two constants at different settings can be determined during calibration using two characteristic photon energies of a $^{22}$Na source: 511 keV and 1275 keV. The actual relative energy resolution can then be corrected as $$\delta_E = \delta_Q \cdot \frac{\beta}{E}\left(e^{\frac{E}{\beta}} - 1\right).$$

The energy resolution shown in FIG. 9F is not very sensitive to the filter capacitance. The over-voltage on the other hand has a greater effect on the energy resolution. Higher voltages suffer from high dark noise and stronger microcell saturation. The 3.5 V gives the best energy resolution of 10.4±0.1% at 20° C.

Figure 9G:
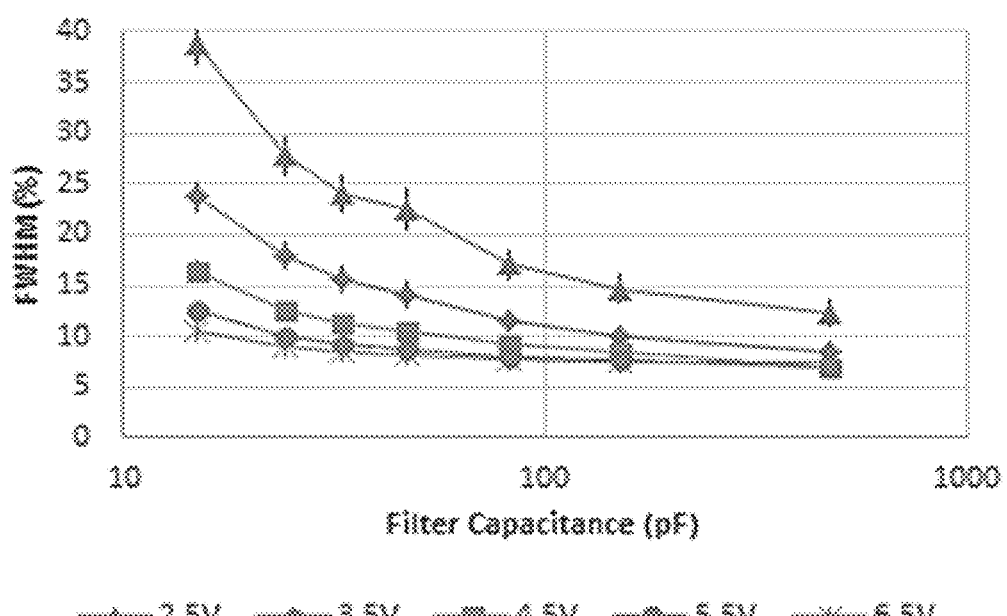
FIG. 9G is a plot of a FWHM of position/crystal ID resolution plotted as a function of the capacitance of the capacitor in the high-pass filter, according to one implementation.

FIG. 9G shows the crystal ID resolution plotted as a function of the capacitance used in the high-pass filter for various over-bias values of the HV. Cleary, the choice of filter capacitance affects the charge distribution in the Anger logic. Weaker filtering brings better crystal separation. However, for discreet crystal arrays, individual crystal can be clearly identified as long as crystal ID resolution (FWHM) is less than 25%. One can also derive the expected crystal ID resolution for other pitches as the resolution is proportional to the inverse of the pitch. For example, with 2×2 mm² crystals, the crystal ID resolution is expected to be twice of what is used to generate FIG. 9G, which uses 4×4 mm² crystals.

Since both the timing resolution and energy resolution affect the performance of a PET scanner, good performance can be achieved by choosing, e.g., a 33 pF filter capacitance for the high-pass filter and 4.5 V over-bias voltage for the HV.

Figure 10A:
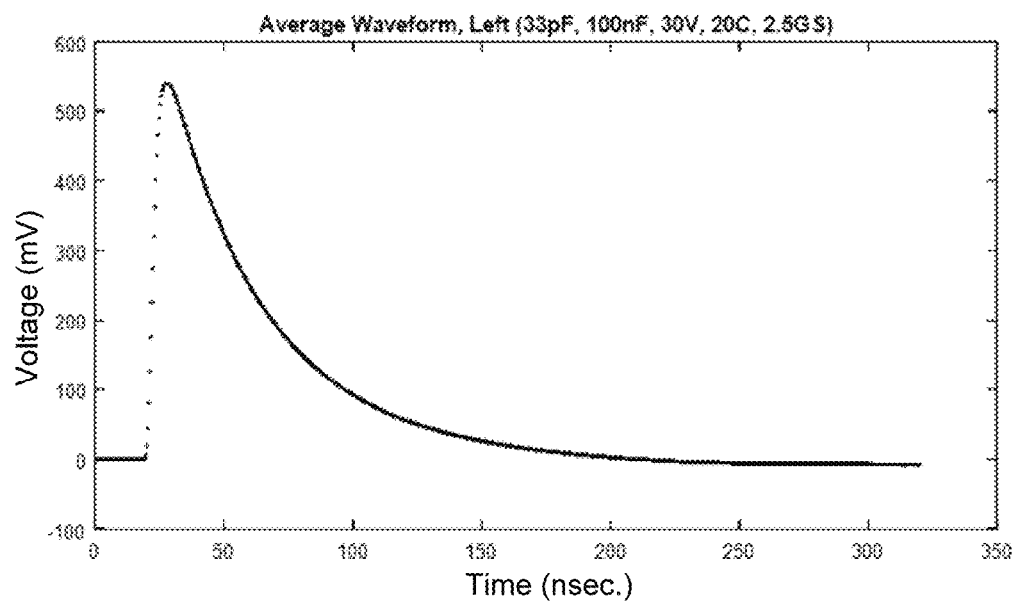
FIG. 10A is a plot of a pulse shape plotted as a function of time for a charge pulse when the high-pass filter includes a 33 pF capacitor and a 400Ω resistor and the capacitors in the capacitor chain have capacitances of 100 nF, according to one implementation.
Figure 10B:
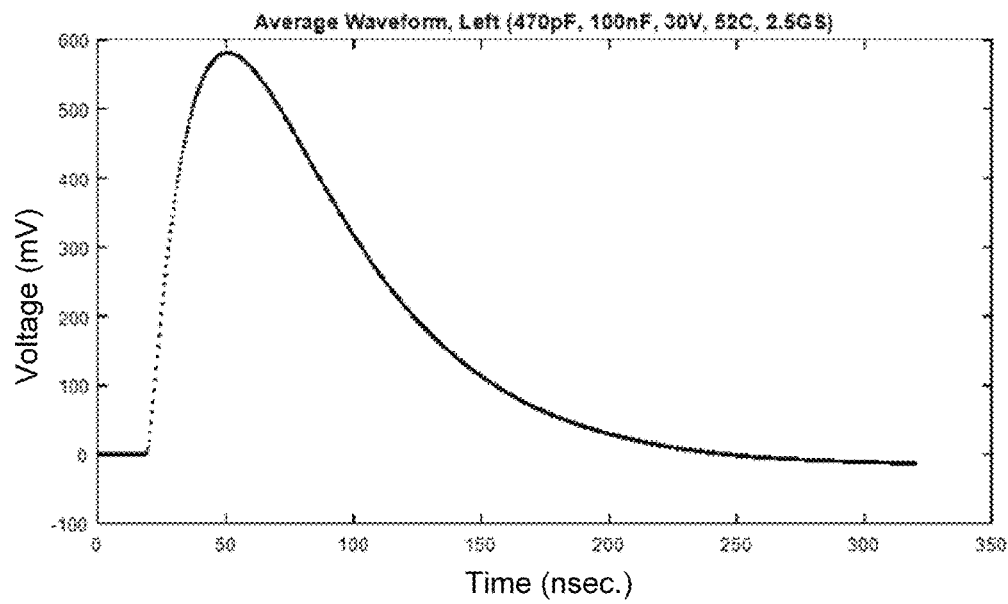
FIG. 10B is a plot of a pulse shape plotted as a function of time for a charge pulse when the high-pass filter includes a 470 pF capacitor and a 400Ω resistor and the capacitors in the capacitor chain have capacitances of 100 nF, according to one implementation.

The high-pass filter provides several advantages for avoiding degradation of the timing information and for suppressing dark current/counts. FIGS. 10A and 10B show the pulse shape (i.e., voltage (mV) as a function of time (nsec.)) with and without the high-pass filter, respectively. The high-pass filter (i) reduces the width of the output pulse, (ii) suppresses the impact at high dark rate, and (iii) improves the signal-to-noise ratio (SNR). The gain is maintained and compensated by the two-stage amplification.

The charge-sharing Anger logic readout circuitry discussed above has several advantages over other approaches. First, the charge-sharing Anger logic improves timing resolution compared with light-sharing in current PET systems. Second, the use of a capacitor chain shows better crystal identification than obtained using a resistor chain. Although, in certain implementations of the method disclosed herein, the capacitor chain can also include resistive elements (i.e., resistors).

Figure 11A:
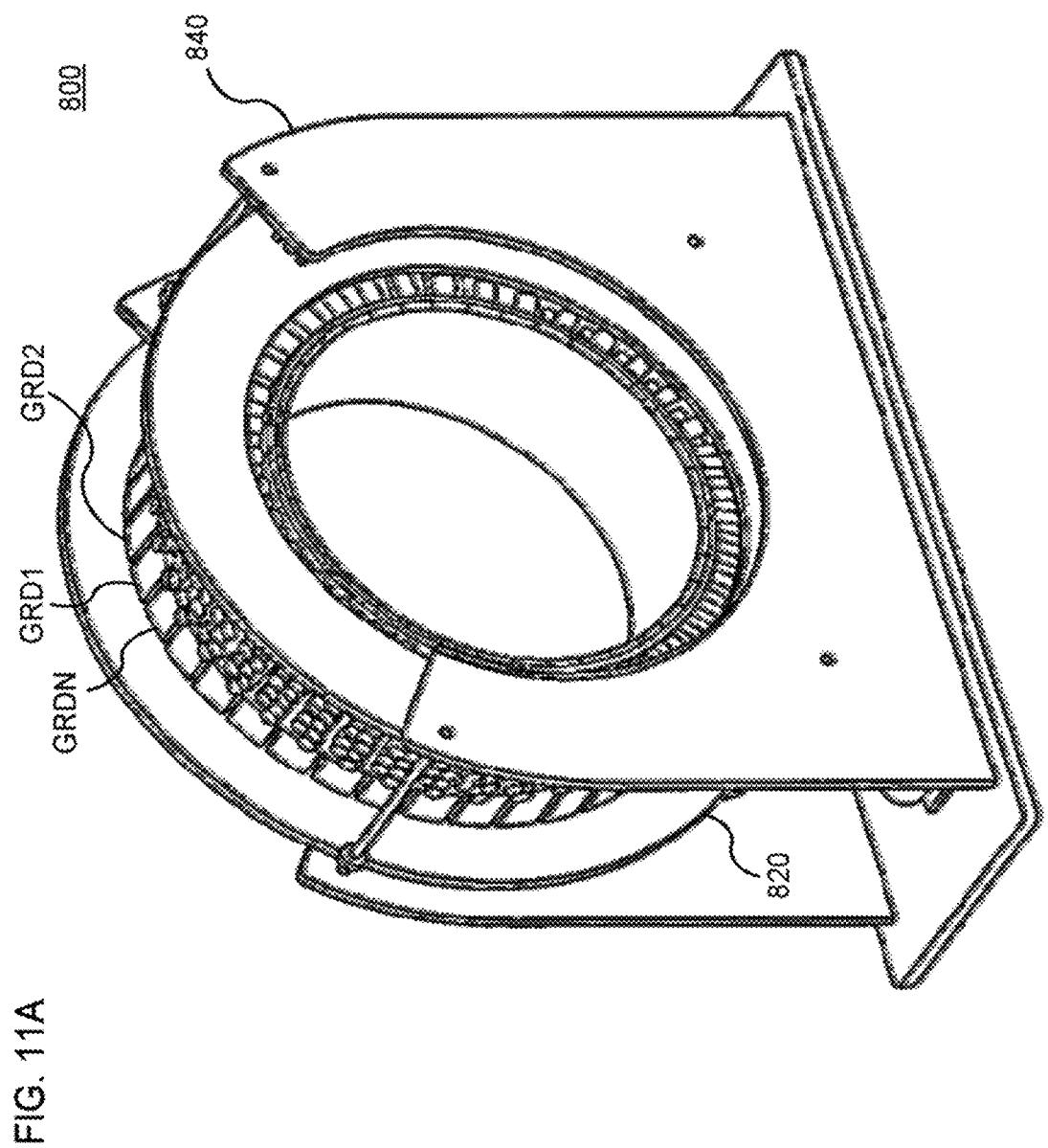
FIG. 11A shows a perspective view of a positron-emission tomography (PET) scanner, according to one implementation.
Figure 11B:
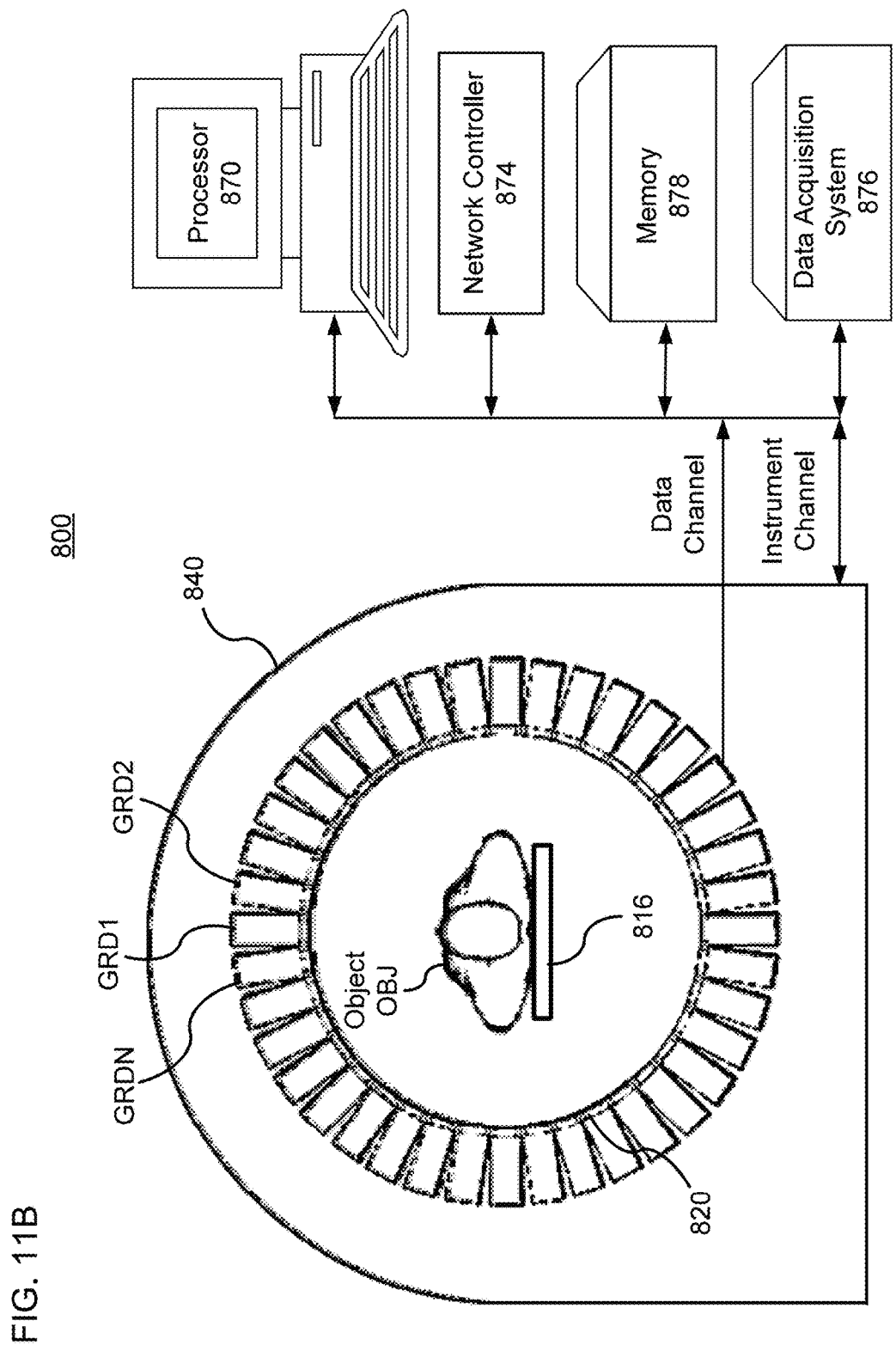
FIG. 11B shows a schematic view of the PET scanner, according to one implementation.

FIGS. 11A and 11B show a non-limiting example of a PET scanner 800 that can implement an image reconstruction method. The PET scanner 800 includes a number of gamma-ray detectors (GRDs) (e.g., GRD1, GRD2, through GRDN) that are each configured as rectangular detector modules. The detector modules GRD1 . . . GRDN can include scintillator crystal arrays, detector arrays of SiPMs, and readout circuitry 300. According to one implementation, the detector ring includes 40 GRDs. In another implementation, there are 48 GRDs, and the higher number of GRDs is used to create a larger bore size for the PET scanner 800.

Each GRD can include a two-dimensional array of individual detector crystals, which absorb gamma radiation and emit scintillation photons. The scintillation photons can be detected by a two-dimensional array of photomultiplier tubes (PMTs) that are also arranged in the GRD. A light guide can be disposed between the array of detector crystals and the PMTs.

Alternatively, the scintillation photons can be detected by an array of silicon photomultipliers (SiPMs), and each individual detector crystals can have a respective SiPM.

Each photodetector (e.g., PMT or SiPM) can produce an analog signal that indicates when scintillation events occur, and an energy of the gamma ray producing the detection event. Moreover, the photons emitted from one detector crystal can be detected by more than one photodetector, and, based on the analog signal produced at each photodetector, the detector crystal corresponding to the detection event can be determined using Anger logic and crystal decoding, for example.

FIG. 11B shows a schematic view of a PET scanner system having gamma-ray photon counting detectors (GRDs) arranged to detect gamma-rays emitted from an object OBJ. The GRDs can measure the timing, position, and energy corresponding to each gamma-ray detection. In one implementation, the gamma-ray detectors are arranged in a ring, as shown in FIGS. 11A and 11B. The detector crystals can be scintillator crystals, which have individual scintillator elements arranged in a two-dimensional array and the scintillator elements can be any known scintillating material. The PMTs can be arranged such that light from each scintillator element is detected by multiple PMTs to enable Anger arithmetic and crystal decoding of scintillation event.

FIG. 11B shows an example of the arrangement of the PET scanner 800, in which the object OBJ to be imaged rests on a table 816 and the GRD modules GRD1 through GRDN are arranged circumferentially around the object OBJ and the table 816. The GRDs can be fixedly connected to a circular component 820 that is fixedly connected to the gantry 840. The gantry 840 houses many parts of the PET imager. The gantry 840 of the PET imager also includes an open aperture through which the object OBJ and the table 816 can pass, and gamma-rays emitted in opposite directions from the object OBJ due to an annihilation event can be detected by the GRDs. The timing and energy information can be used to determine coincidences for gamma-ray pairs.

In FIG. 11B, circuitry and hardware is also shown for acquiring, storing, processing, and distributing gamma-ray detection data. The circuitry and hardware include: a processor 870, a network controller 874, a memory 878, and a data acquisition system (DAS) 876. The PET imager also includes a data channel that routes detection measurement results from the GRDs to the DAS 876, a processor 870, a memory 878, and a network controller 874. The data acquisition system 876 can control the acquisition, digitization, and routing of the detection data from the detectors. In one implementation, the DAS 876 controls the movement of the bed 816. The processor 870 performs functions including pre-reconstruction processing of the detection data, reconstructing images from the detection data, and post-reconstruction processing of the image data, as discussed herein.

The processor 870 can be configured to perform the image reconstruction method. The processor 870 can include a CPU that can be implemented as discrete logic gates, an Application Specific Integrated Circuit (ASIC), a Field Programmable Gate Array (FPGA) or other Complex Programmable Logic Device (CPLD). An FPGA or CPLD implementation may be coded in VHDL, Verilog, or any other hardware description language and the code may be stored in an electronic memory directly within the FPGA or CPLD, or as a separate electronic memory. Further, the memory may be non-volatile, such as ROM, EPROM, EEPROM or FLASH memory. The memory can also be volatile, such as static or dynamic RAM. The processor, such as a microcontroller or microprocessor, may be provided to manage the electronic memory as well as the interaction between the FPGA or CPLD and the memory.

Alternatively, the CPU in the processor 870 can execute a computer program including a set of computer-readable instructions that perform the image reconstruction method, the program being stored in any of the above-described non-transitory electronic memories and/or a hard disk drive, CD, DVD, FLASH drive or any other known storage media. Further, the computer-readable instructions may be provided as a utility application, background daemon, or component of an operating system, or combination thereof, executing in conjunction with a processor, such as a Xeon processor from Intel of America or an Opteron processor from AMD of America, and an operating system, such as Microsoft VISTA, UNIX, Solaris, LINUX, Apple, MAC-OS and other operating systems known to those skilled in the art. Further, CPU can be implemented as multiple processors cooperatively working in parallel to perform the instructions.

The memory 878 can be a hard disk drive, CD-ROM drive, DVD drive, FLASH drive, RAM, ROM or any other electronic storage known in the art.

The network controller 874, such as an Intel Ethernet PRO network interface card from Intel Corporation of America, can interface between the various parts of the PET imager. Additionally, the network controller 874 can also interface with an external network. As can be appreciated, the external network can be a public network, such as the Internet, or a private network such as an LAN or WAN network, or any combination thereof and can also include PSTN or ISDN sub-networks. The external network can be wired, such as an Ethernet network, or can be wireless such as a cellular network including EDGE, 3G and 4G wireless cellular systems. The wireless network can also be WiFi, Bluetooth, or any other wireless form of communication that is known.

While certain implementations have been described, these implementations have been presented by way of example only, and are not intended to limit the teachings of this disclosure. Indeed, the novel methods, apparatuses and systems described herein may be embodied in a variety of other forms; furthermore, various omissions, substitutions and changes in the form of the methods, apparatuses and systems described herein may be made without departing from the spirit of this disclosure.

The invention claimed is:

1. A gamma ray detector apparatus, comprising:
   a row of detector elements configured to generate, upon detecting a gamma ray, respective current pulses;
   a chain of capacitors, each capacitor of the chain of capacitors arranged between electrodes of two adjacent detector elements of the row of detector elements;
   a first high-pass filter having an input connected to a first end of the chain of capacitors and having an output connected to a first amplifier to generate a first output;
   a second high-pass filter having an input connected to a second end of the chain of capacitors and having an output connected to a second amplifier to generate a second output; and
   circuitry configured to perform Anger logic based on the first output and the second output, the Anger logic estimating one of a position along the row of detector elements and a detector element in the row of detector elements at which the current pulse originated.

2. The apparatus according to claim 1, further comprising:
   a plurality of capacitor chains, which includes the chain of capacitors, each of the plurality of capacitor chains configured along a respective row of a two-dimensional detector array, the two-dimensional detector array having detector elements arranged along a column direction and along a row direction, and each end of the each of the plurality of capacitor chains terminating at a respective high-pass filter that is connected to a respective row amplifier;
   a first column amplifier connected via a first plurality of weighting resistors to respective first outputs of the row amplifiers, which are at a first end of the plurality of capacitor chains, the first column amplifier generating a third output; and
   a second column amplifier connected via a second plurality of weighting resistors to the respective first outputs of the row amplifiers, the second column amplifier generating a fourth output, wherein
   a gain of the first column amplifier with respect to the first output from a one of the row amplifiers is based on a resistance value of a weighting resistor of the first plurality of weighting resistors that connects the one of the row amplifiers to the first column amplifier,
   a gain of the second column amplifier with respect to the first output from the one of the row amplifiers is based on a resistance value of a weighting resistor of the second plurality of weighting resistors that connects the one of the row amplifiers to the second column amplifier, and
   the circuitry is further configured to perform the Anger logic based on the third output and the fourth output, the Anger logic estimating one of a position in the column direction and a column in the two-dimensional detector array at which the current pulse originated.

3. The apparatus according to claim 2, further comprising:

a third column amplifier connected via a third plurality of weighting resistors to respective second outputs of the row amplifiers, which are at a second end of the plurality of capacitor chains, the third column amplifier generating a fifth output; and a fourth column amplifier connected via a fourth plurality of weighting resistors to the respective second outputs of the row amplifiers, the fourth column amplifier generating a sixth output, wherein a gain of the third column amplifier with respect to the first output from a one of the row amplifiers is based on a resistance value of a weighting resistor of the third plurality of weighting resistors that connects the one of the row amplifiers to the third column amplifier, a gain of the fourth column amplifier with respect to the second output from the one of the row amplifiers is based on a resistance value of a weighting resistor of the fourth plurality of weighting resistors that connects the one of the row amplifiers to the fourth column amplifier, and the circuitry is further configured to perform the Anger logic based on the third output, the fourth output, the fifth output, and the sixth output, the Anger logic estimating one of a position in the row direction and a row in the two-dimensional detector array at which the current pulse originated, in addition to the estimating the one of the position in the column direction and the column in the two-dimensional detector array at which the current pulse originated.

4. The apparatus according to claim 3, wherein, for each column amplifier of the first, second, third, and fourth column amplifiers, resistance values of the corresponding plurality of weighting resistors are selected to produce a uniform spacing between values generated by the Anger logic for the position in the column direction.

5. The apparatus according to claim 2, wherein, for each of the plurality of capacitor chains, capacitor values of the each capacitor chain are selected to produce a uniform spacing between values generated by the Anger logic for the position in the row direction.

6. The apparatus according to claim 2, wherein
the first column amplifier mitigates an effect of a termination impedance of the third output on a time response of the third output; and
the second column amplifier mitigates an effect of a termination impedance of the fourth output on a time response of the fourth output.

7. The apparatus according to claim 2, wherein
a combination of (i) a row amplifier and (ii) a corresponding weighting resistors of the first plurality of weighting resistors together with (iii) the first column amplifier comprises a two-stage summing amplifier; and
a combination of (i) the row amplifier and (ii) a corresponding weighting resistors of the second plurality of weighting resistors together with (iii) the second column amplifier comprises another two-stage summing amplifier.

8. The apparatus according to claim 1, wherein capacitor values of the chain of capacitors are selected to produce a uniform spacing between values generated by the Anger logic for the position in the row direction.

9. The apparatus according to claim 1, wherein each detector element of the row of detector elements is a silicon photomultiplier (SiPM) biased above a breakdown voltage.

10. The apparatus according to claim 1, further comprising respective bias resistors in series with the respective detector elements of the row of detector elements, each of the respective bias resistors having one end connected to ground.

11. The apparatus according to claim 1, further comprising:
respective bias resistors in series with the respective capacitors in the chain of capacitors, wherein
detector elements of the row of detector elements are biased above a breakdown voltage by a predefined voltage, the predefined voltage being in a range of 1 volts (V) to 10 V,
the first high-pass filter including a capacitor having a first predefined capacitance, and the second high-pass filter including a capacitor having the first predefined capacitance, the first predefined capacitance being in a range of 10 picoFarads (pF) to 500 pF,
the first high-pass filter including a resistor having a predefined resistance, and the second high-pass filter including a resistor having the predefined resistance, the predefined resistance being in a range of 10 ohms ($\Omega$) to 500$\Omega$, and
the capacitors of the chain of capacitors having a second predefined capacitance, the second predefined capacitance being in a range of 10 nanoFarads (nF) to 1000 nF.

12. The apparatus according to claim 1, wherein the chain of capacitors further includes a respective resistor either in series with or in parallel with each of the capacitors of the chain of capacitors.

13. An apparatus, comprising:
a plurality of capacitor chains, each of the plurality of capacitor chains configured along a respective row of a two-dimensional detector array, the two-dimensional detector array having detector elements arranged along a column direction and along a row direction, and each end of the each of the plurality of capacitor chains terminating at a respective high-pass filter that is connected to a respective row amplifier;
a first column amplifier connected via a first plurality of weighting resistors to respective first signals from a first subset of the row amplifiers that is at a first end of the plurality of capacitor chains, the first column amplifier generating a first output;
a second column amplifier connected via a second plurality of weighting resistors to the respective first signals, the second column amplifier generating a second output;
a third column amplifier connected via a third plurality of weighting resistors to respective second signals from a second subset of the row amplifiers that is at a second end of the plurality of capacitor chains, the third column amplifier generating a third output;
a fourth column amplifier connected via a fourth plurality of weighting resistors to the respective second signals, the fourth column amplifier generating a fourth output; and
circuitry configured to perform Anger logic based on the first output, the second output, third output, and the fourth output, the Anger logic (i) estimating one of the position in the column direction and a column in the two-dimensional detector array at which a current pulse originated, and (ii) estimating one of a position in the row direction and a row in the two-dimensional detector array at which the current pulse originated.

14. The apparatus according to claim 13, further comprising:
- scintillator crystals arranged in the two-dimensional array, each of the scintillator crystals corresponding to a respective detector element of the two-dimensional detector array, wherein
- the Anger logic estimates a scintillator crystal of the two-dimensional array at which a gamma ray is absorbed resulting in scintillation photons.

15. The apparatus according to claim 13, wherein each detector element of the row of detector elements is a silicon photomultiplier (SiPM) biased above a breakdown voltage.

16. The apparatus according to claim 13, further comprising an analog-to-digital converter generating position information, timing information, and energy information based on the first output, the second output, the third output, and the fourth output.

17. The apparatus according to claim 16, wherein the energy information includes an energy of an absorbed gamma ray that is generated using a sum of the first output, the second output, the third output, and the fourth output.

18. The apparatus according to claim 16, wherein the timing information includes an arrival time of an absorbed gamma ray that is generated using a sum of the first output, the second output, the third output, and the fourth output.

19. The apparatus according to claim 13, wherein the high-pass filters each include a resistor and a capacitor, which have values selected to provide a pulse shape that optimizes timing information of an arrival time of a gamma ray detected by one of the detector elements of the two-dimensional detector array.

\* \* \* \* \*